United States Patent
Choi et al.

(12)

(10) Patent No.: US 6,707,738 B2
(45) Date of Patent: Mar. 16, 2004

(54) SEMICONDUCTOR MEMORY DEVICE HAVING MESH-TYPE STRUCTURE OF PRECHARGE VOLTAGE LINE

(75) Inventors: Jang-Seok Choi, Yongin (KR); Sung-min Yim, Pyungtaek (KR); Hyung-dong Kim, Suwon (KR); Duk-ha Park, Suwon (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 0 days.

(21) Appl. No.: 10/145,001

(22) Filed: May 14, 2002

(65) Prior Publication Data

US 2003/0112679 A1 Jun. 19, 2003

(30) Foreign Application Priority Data

Dec. 15, 2001 (KR) .......................... 2001-79692

(51) Int. Cl.[7] ................................. G11C 7/00
(52) U.S. Cl. .................. 365/203; 365/201; 365/222
(58) Field of Search ................. 365/203, 201, 365/222, 205, 208, 226, 233, 189.09

(56) References Cited

U.S. PATENT DOCUMENTS 5,956,279 A  *  9/1999 Mo et al. ..................... 365/201
6,487,137 B2  *  11/2002 Tsuboi et al. ................ 365/226

* cited by examiner

Primary Examiner—Gene Auduong
(74) Attorney, Agent, or Firm—F. Chau & Associates, LLP

(57) ABSTRACT

A semiconductor memory device having a mesh-type structure of a precharge voltage line is provided. The semiconductor memory device includes a plurality of memory cell arrays, a plurality of bit line precharge circuit units, and a first precharge voltage line and a second precharge voltage line. Each of the plurality of memory cell arrays include a plurality of memory cells and a plurality of bit line pairs for outputting and receiving data to and from each of the memory cells and are arranged in a matrix. The plurality of bit line precharge circuit units precharge and equalize corresponding bit line pairs of the memory cell arrays into predetermined precharge voltages. The first precharge voltage line and the second precharge voltage line are arranged in a mesh in each region between the plurality of memory cell arrays. During a first mode of operation, the first precharge voltage line and the second precharge voltage line supply a common precharge voltage and during a second precharge voltage line, precharge voltages having different levels are supplied at the first and the second precharge voltage lines to precharge memory cells adjacent to one another with different precharge voltages.

25 Claims, 5 Drawing Sheets

SEMICONDUCTOR MEMORY DEVICE HAVING MESH-TYPE STRUCTURE OF PRECHARGE VOLTAGE LINE

BACKGROUND OF THE INVENTION

1. Field of the Invention

The present invention relates to a semiconductor memory device, and more particularly, to a structure of a power supply line for supplying a precharge voltage in a dynamic random access memory (DRAM) device.

2. Description of the Related Art

A semiconductor memory device such as a DRAM, as is well known to one skilled in the art, includes memory cell arrays, bit line circuits, and bit line sense amplifiers.

FIG. 1 is a schematic diagram of a conventional semiconductor memory device. Referring to FIG. 1, memory cell array 100 includes a plurality of word lines WL0~WLm in a row direction, a plurality of bit line pairs BL0 and /BL0 in a column direction, and a plurality of memory cells (not shown), which are arranged in a matrix in a region where the plurality of word lines WL0~WLm intersect the plurality of bit lines BL0 and /BL0. For convenience, complementary bit lines are expressed $\overline{BL}$ in the drawings and /BL in the specification.

Data stored in memory cells are output through the bit line pairs BL0 and /BL0 when a high voltage is applied to a corresponding word line, and a bit line sense amplifier 120 senses the variation in voltages loading on the bit line pairs BL0 and /BL0, and thereby the data stored in the memory cells are read. External data are also written into the memory cells through the bit line pairs BL0 and /BL0.

Before the data are read and written from and into the memory cells, the bit line pairs BL0 and /BL0 are precharged and equalized into a predetermined precharge voltage VBL. A bit line precharge circuit 211 performs precharging and equalizing of the bit line pairs BL0 and /BL0 in response to a precharge signal PEQ.

The precharge voltage VBL is used as a data-discriminating reference voltage. If the level of VBL, or the potential of the precharge voltage VBL is varied at the different locations of the memory array or the semiconductor device, characteristics of the semiconductor memory device may become unstable when data are read and written from and into memory cells.

Thus, the same precharge voltage VBL is supplied to all bit line pairs and is used as a data-discriminating reference voltage in a conventional semiconductor memory device. That is, a common precharge voltage generator (not shown) is used in the conventional semiconductor memory device to generate a precharge voltage VBL which is supplied to all bit line pairs; thus, all bit line pairs receive the same precharge voltage VBL. This conventional structure in supplying VBL may result in lower testing efficiency. For example, during a wafer burn-in test mode, data is input directly into bit line pairs with a precharge voltage line applied, and data is written into memory cells. However, in a structure constituted to supply only a precharge voltage VBL having a single level as with the conventional semiconductor memory device, only one data can be input into all memory cells, and thus the number of test vectors that can be inputted is limited. That is, in a semiconductor memory device having the structure constituted to supply only a precharge voltage VBL, different data cannot be written into adjacent bit line pairs during testing, thereby lowering testing efficiency.

One prior art proposal to overcome the above disadvantage involves a semiconductor memory device having different voltages supplied to adjacent bit line pairs by variably adjusting a time for applying the precharge voltage VBL during a testing operation of a semiconductor memory device.

FIG. 2 is a circuit diagram of a conventional memory cell array of a semiconductor memory device.

Referring to FIG. 2, even-numbered bit line pairs BL0 & /BL0~BLn & /BLn among a plurality of bit line pairs BL0 & /BL0~BLn+1 & /BLn+1, which are included in a memory cell array 100, are precharged and equalized through a first bit line precharge circuit unit 210 at a lower part of the memory cell array 100, and odd-numbered bit line pairs BL1 & /BL1~BLn+1 & /BLn+1 among the plurality of bit line pairs BL0 & /BL0~BLn+1 & /BLn+1 are precharged and equalized through a second bit line precharge circuit unit 220 at an upper part of the memory cell array 100. The first and second bit line precharge circuit units 210 and 220 are controlled by first and second precharge signals PEQj and PEQi, respectively.

Thus, the second precharge signal PEQi is discriminated from the first precharge signal PEQj in a test mode, and thereby discriminating voltages are applied to the adjacent bit line pairs. However, in the conventional semiconductor memory device shown in FIG. 2, different voltages cannot be simultaneously applied to the adjacent bit line pairs.

Accordingly, a need exists a semiconductor memory device capable of simultaneously applying different voltages to adjacent bit line pairs during a testing operation to increase test efficiency and production yield. Furthermore, a need also exists a semiconductor memory device capable of preventing danger in which data can be unstably discriminated due to a difference in levels of precharge voltages in a normal operation mode in the case of using where two or more precharge voltages.

SUMMARY OF THE INVENTION

A semiconductor memory device is provided, which includes: a plurality of memory cell arrays arranged in a matrix, each of the plurality of memory cell arrays having a plurality of memory cells and a plurality of bit line pairs for outputting and receiving data to and from each of the memory cells; a plurality of bit line precharge circuit units for precharging and equalizing corresponding bit line pairs of the memory cell arrays into predetermined precharge voltages; and a first precharge voltage line and a second precharge voltage line arranged in each region between the plurality of memory cell arrays, wherein during a first mode of operation, the first precharge voltage line and the second precharge voltage line supply a common precharge voltage and during a second mode of operation, precharge voltages having different levels are supplied at the first and the second precharge voltage lines to precharge memory cells adjacent to one another with different precharge voltages.

According to an embodiment of the present invention, the plurality of bit line precharge circuit units include a plurality of upper bit line precharge circuit units positioned at an upper part the plurality of memory cell arrays and a plurality of lower bit line precharge circuit units positioned at a lower part of the plurality of memory cell arrays, the plurality of upper bit line precharge circuit units alternately precharge bit line pairs of a corresponding memory cell array and the plurality of lower bit line precharge circuit units alternately precharge the remaining bit line pairs of the corresponding memory cell array. The first mode is normal operation mode and the second mode is test mode. The precharge voltages having different levels are applied to the bit line pairs from the outside through pads of the semiconductor memory device, and the precharge voltages having the same level are generated in a precharge voltage generator of the semiconductor memory device.

A semiconductor memory device is also provided, which includes: a plurality of memory cell arrays arranged in a matrix, each of the plurality of memory cell arrays having a plurality of memory cells and a plurality of bit line pairs for outputting and receiving data to and from each of the memory cells; a plurality of bit line precharge circuit units for precharging and equalizing corresponding bit line pairs of the memory cell arrays into predetermined precharge voltages; first and second row precharge voltage lines arranged alternately in a first predetermined direction, the first row precharge voltage line for supplying a first precharge voltage to first bit line pairs connected to the first row precharge voltage line and the second row precharge voltage line for supplying a second precharge voltage to the second bit line pairs connected to the second row precharge voltage line; and first and second column precharge voltage lines arranged alternately in a second predetermined direction, the first column precharge voltage line for supplying the first precharge voltage to third bit line pairs connected to the first column precharge voltage line and the second column precharge voltage line for supplying the second precharge voltage to fourth bit line pairs connected to the second column precharge voltage line, wherein the first and second precharge voltages are different voltage levels in a predetermined test mode and are the same voltage level in a normal operation mode.

According to an embodiment of the present invention, the plurality of bit line precharge circuit units include a plurality of upper bit line precharge circuit units positioned at an upper part of the memory cell arrays and a plurality of lower bit line precharge circuit units positioned at a lower part the memory cell arrays, the plurality of upper bit line precharge circuit units alternately precharge bit line pairs of the corresponding memory cell array, and the plurality of lower bit line precharge circuit units alternately precharge the remaining bit line pairs of the corresponding memory cell array.

According to an embodiment of the present invention, the device further includes a precharge voltage equalizer for connecting the first row precharge voltage line to the first column precharge voltage line connecting the second row precharge voltage line to the second column precharge voltage line in a test mode, and for separating first row precharge voltage line from the first column precharge voltage line and separating the second row precharge voltage line to the second column precharge voltage line in a normal operation mode. The device also further includes: a first main precharge voltage line for supplying the first precharge voltage to the first row precharge voltage lines and the first column precharge lines; and a second main precharge voltage line for supplying the second precharge voltage to the second row precharge voltage lines and the second column precharge lines.

According to an embodiment of the present invention, the first and second main precharge voltage lines are formed of metals in a first layer, and the first and second row precharge voltage lines are formed of metals in a second layer, and the first and second column precharge voltage lines are formed of polysilicon in a third layer. The first predetermined direction is a row direction of the semiconductor memory device, and the second predetermined direction is a column direction of the semiconductor memory device. The first and second row precharge voltage lines are arranged in the row direction in a region between the memory cell arrays, and the first and second column precharge voltage lines are arranged in the column direction in a region between the memory cell arrays. The first precharge voltage and the second precharge voltage having different levels are applied to the bit line pairs from the outside through pads of the semiconductor memory device, and the first precharge voltages and the second precharge voltage having the same level are generated in a precharge voltage generator of the semiconductor memory device. The test mode is a wafer burn-in test mode.

A method of operating and testing a semiconductor memory device having a plurality of memory cell arrays arranged in a matrix, each of the plurality of memory cell arrays having a plurality of memory cells and a plurality of bit line pairs for outputting and receiving data to and from each of the memory cells is also provided, the method including the steps of; supplying a first precharge voltage to the first bit line pairs connected to a first plurality of voltage lines arranged alternately with a second plurality of voltage lines; and supplying a second precharge voltage to second bit line pairs connected to the second plurality of voltage lines, wherein the first and second precharge voltages are different voltage levels in a predetermined test mode and are at the same voltage level in a normal operation mode.

According to an embodiment of the present invention, the method further including the step of precharging and equalizing corresponding the first bit line pairs and the second bit line pairs into predetermined precharge voltages. The step of precharging and equalizing is performed in a plurality of first bit line precharge circuit units having the first bit line pairs and in a plurality of second bit line precharge circuit units having the second bit line pairs. The plurality of first bit line precharge circuit units are positioned at a first of the memory cell arrays and the plurality of second bit line precharge circuit units are positioned at a second part the memory cell arrays, the first part and the second part are disposed opposite sides of the memory cell arrays. The plurality of first bit line precharge circuit units alternately precharges bit line pairs of the corresponding memory cell array, and the plurality of second bit line precharge circuit units alternately precharge the remaining bit line pairs of the corresponding memory cell array.

According to an embodiment of the present invention, the method further including the steps of: connecting the first precharge voltage line to the second precharge voltage line in the test mode; and separating the first precharge voltage line from the second precharge voltage line in the normal operation mode. The steps of connecting the first precharge voltage line to the second precharge voltage line in the test mode and separating the first precharge voltage line from the second precharge voltage line in the normal operation mode are performed in a precharge voltage equalizer. The precharge voltage equalizer includes a switch between the first precharge voltage line and the second precharge voltage line. The switch is turned on or off in response to a test mode signal.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1:
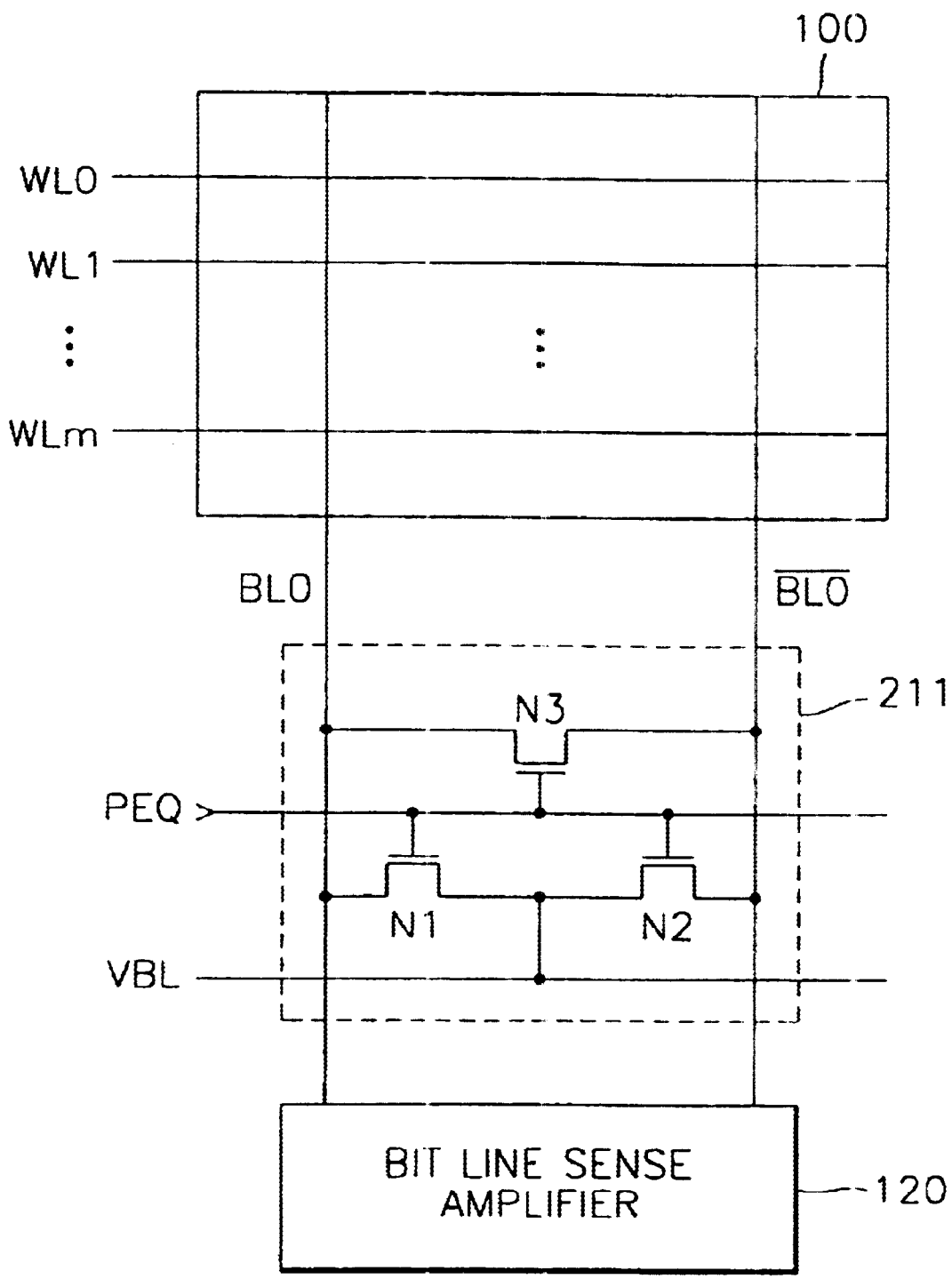
FIG. 1 is a schematic diagram of a conventional semiconductor memory device.
Figure 2:
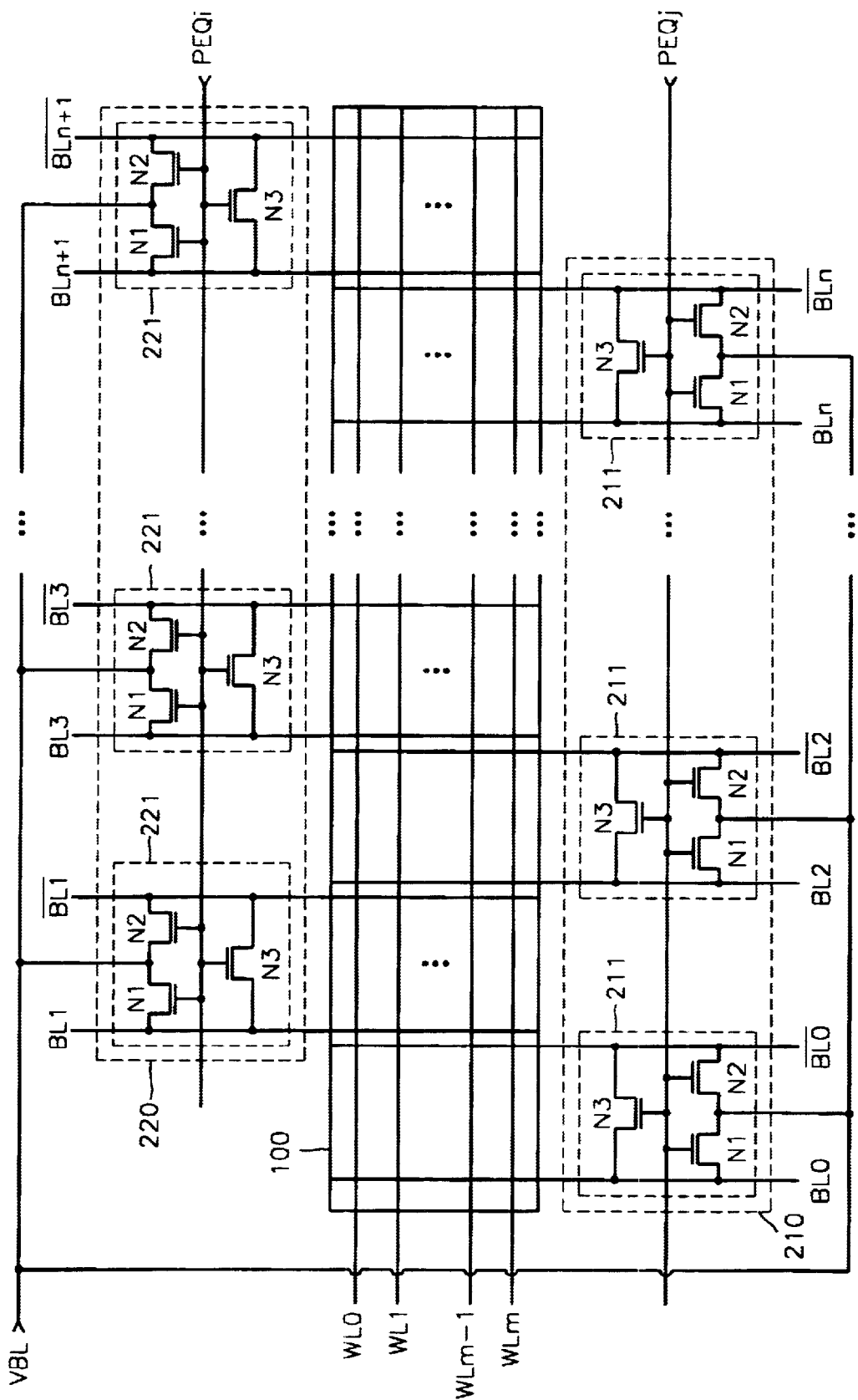
FIG. 2 is a circuit diagram of a conventional memory cell array of a semiconductor memory device.

Hereinafter, the present invention will be described in detail by describing preferred embodiments of the invention with reference to the accompanying drawings. Like reference numerals refer to like elements throughout the drawings.

Figure 3:
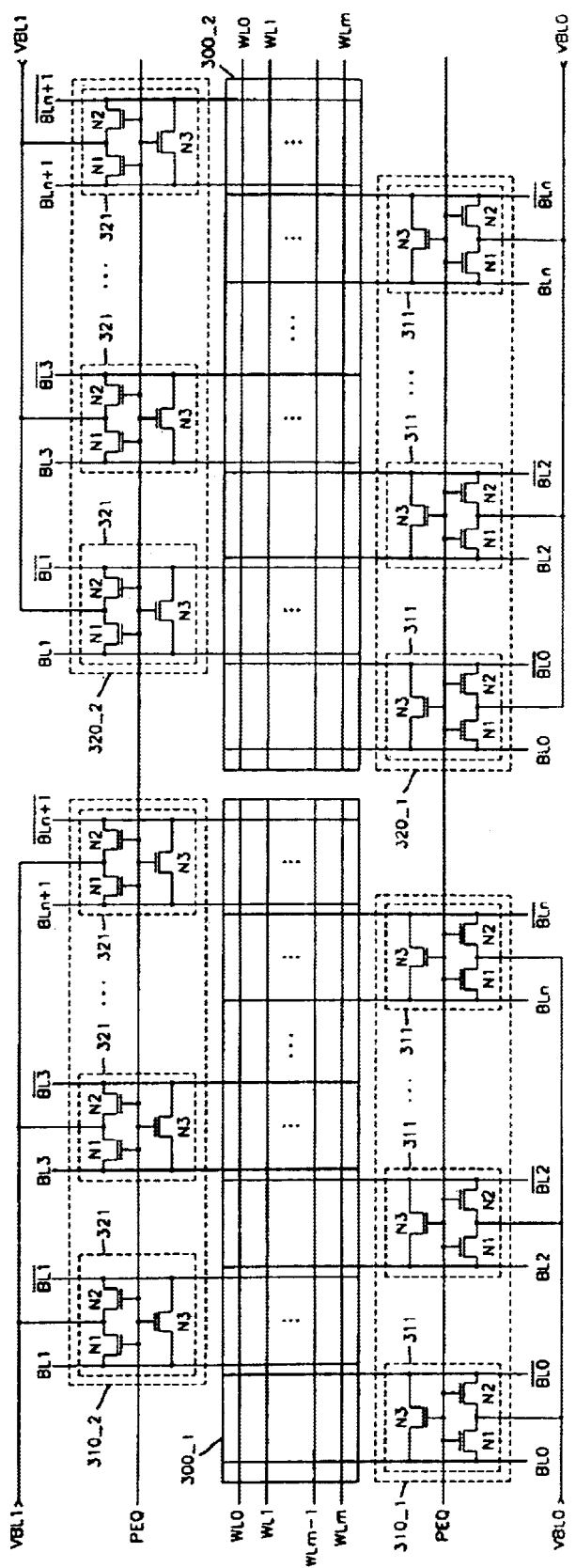
FIG. 3 is a circuit diagram of a semiconductor memory device according to an embodiment of the present invention.

FIG. 3 is a circuit diagram of a semiconductor memory device according to an embodiment of the present invention. Referring to FIG. 3, the semiconductor memory device includes a plurality of memory cell arrays and a plurality of bit line precharge circuit units. For the convenience of explanation, two memory cell arrays 300_1 and 300_2 and four bit line precharge circuit units 310_1, 310_2, 320_1, and 320_2 are shown in FIG. 3.

The first and second bit line precharge circuit units 310_1 and 310_2 are arranged under and on the first memory cell array 300_1, respectively. The first bit line precharge circuit unit 310_1 alternately precharges and equalizers a plurality of even-numbered bit line pairs BL0 and /BL0~BLn and /BLn of the first memory cell array 300_1 by using a first precharge voltage VBL0. The second bit line precharge circuit unit 310_2 precharges and equalizes a plurality of odd-numbered bit line pairs BL1 and /BL1~BLn+1 and /BLn+1 of the first memory cell array 300_1 by using a second precharge voltage VBL1.

In a similar manner, the third and fourth bit line precharge circuit units 320_1 and 320_2 are arranged under and on the second memory cell array 300_2, respectively. The third bit line precharge circuit unit 320_1 precharges and equalizes a plurality of even-numbered bit line pairs BL0 and /BL0~BLn and /BLn of the second memory cell array 300_2 by using the first precharge voltage VBL0. The fourth bit line precharge circuit unit 320_2 precharges and equalizes a plurality of odd-numbered bit line pairs BL1 and /BL1~BLn+1 and /BLn+1 of the second memory cell array 300_2 by using the second precharge voltage VBL1.

The first and third bit line precharge circuit units 310_1 and 320_1 include a plurality of first precharge circuits 311 corresponding to the plurality of even-numbered bit line pairs BL0 and /BL0~BLn and /BLn. Likewise, the second and fourth bit line precharge circuit units 310_2 and 320_2 include a plurality of second precharge circuits 321 corresponding to the plurality of odd-numbered bit line pairs BL1 and /BL1 BLn+1 and /BLn+1. Each of the precharge circuits 311 and 321 includes three NMOS transistors N1~N3.

In the above manner, the first and second precharge voltages VBL0 and VBL1 are alternately applied to the first through fourth bit line precharge circuit units 310_1, 310_2, 320_1, and 320_2, which are adjacent upwardly and downwardly to one another between which the memory cell arrays 300_1 and 300_2 are interposed. Thus, as with the semiconductor memory device according to an embodiment of the present invention shown in FIG. 3, in a structure in which adjacent bit line pairs in a memory cell array are connected to upward and downward bit line precharge circuit units, precharge voltages having different levels can be applied to the adjacent bit line pairs, and thereby different data can be written into the adjacent memory cells.

In a normal operation mode of the semiconductor memory device, the first and second precharge voltages VBL0 and VBL1 have the same voltage levels. Thus, the plurality of bit line pairs BL0 and /BL0~BLn+1 and /BLn+1 of the semiconductor memory device are precharged by the same precharge voltages. That is, the same precharge voltages are generated in a precharge voltage generator (not shown) regardless of using a precharge voltage generator or two precharge voltage generators during a normal operation.

On the other hand, in a test mode of the semiconductor memory device, the first and second precharge voltages VBL0 and VBL1 have different voltage levels. Thus, precharge voltages having different levels are applied to the adjacent bit line pairs, thereby different data are written into the adjacent memory cells. In general, voltages are not supplied from the precharge voltage generator during a test operation but externally supplied voltages are used during the test operation.

Figure 4:
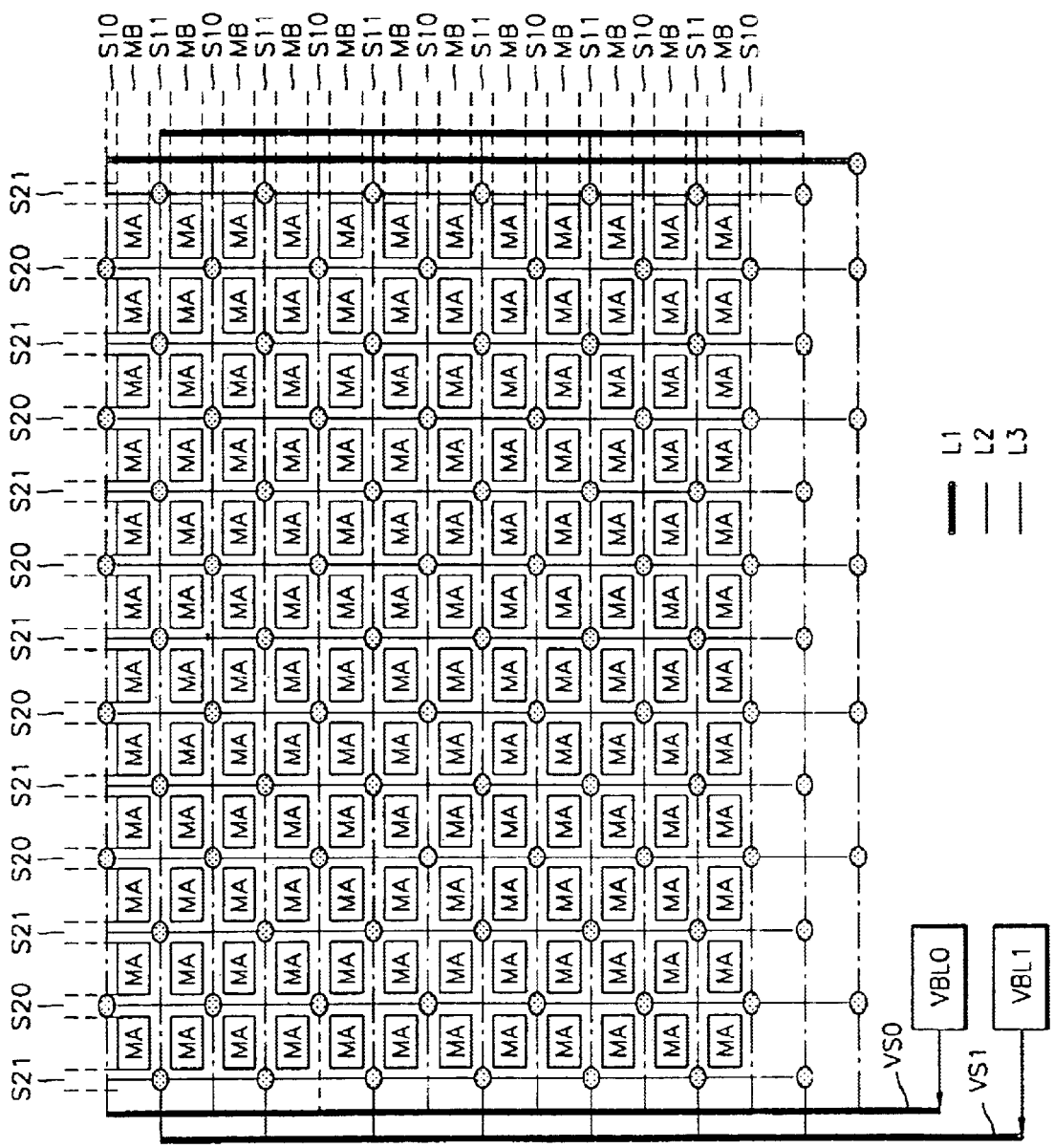
FIG. 4 is an arrangement of precharge voltage lines of the semiconductor memory device according to an embodiment of the present invention.

FIG. 4 is an arrangement of a precharge voltage line of the semiconductor memory device according to an embodiment of the present invention.

Referring to FIG. 4, a semiconductor memory device includes a plurality of memory cell arrays MA arranged in a matrix. Each of the memory cell arrays MA includes a plurality of memory cells (not shown) arranged in a row direction and a plurality of bit line pairs (not shown) for outputting and receiving data to and from the memory cells arranged in a column direction. In FIG. 4, a memory bank MB represents a row of the plurality of memory cell arrays MA. That is, the plurality of memory cell arrays arranged in a row constitute a memory bank MB.

Bit line precharge circuit units (not shown) and bit line sense amplifiers (not shown) corresponding to the upward and downward memory cell arrays MA are arranged in a row direction in regions S10 and S11 between the upward and downward memory cell arrays.

Sub word line drivers (not shown) corresponding to right and left memory cell arrays MA, which are adjacent to one another from side to side, are arranged in a column direction in regions S20 and S21 between the right and left memory cell arrays MA.

First and second precharge voltage lines VS0 and VS1 for supplying first and second precharge voltages VBL0 and VBL1 are arranged in a mesh structure to throughout semiconductor memory array regions. That is, the first and second precharge voltage lines VS0 and VS1 are arranged in row and column directions in each region between the memory cell arrays MA, and thereby having a mesh structure such as a net. Both the first and second precharge voltage lines VS0 and VS1 are not arranged in each region between the memory cell arrays MA but alternately arranged in each region between the memory cell arrays MA.

According to an embodiment of the present invention, two main precharge voltage lines L1 are arranged in a direction (here, in a column direction) outside memory array regions. The two main precharge voltage lines L1 includes the first precharge voltage lines VS0 for supplying the first precharge voltage VBL0 and the second precharge voltage lines VS1 for supplying the second precharge voltage VBL1. Preferably, the main precharge voltage lines L1 are formed from metals or metallic materials.

Two row precharge voltage lines L2 are alternately arranged in a row direction, using the regions S10 and S11 in which the bit line sense amplifiers are arranged. As with the main precharge voltage lines L1, the two row precharge voltage lines L2 include the first precharge voltage lines VS0 for supplying the first precharge voltage VBL0 and the second precharge voltage lines VS1 for supplying the second precharge voltage VBL1.

The row precharge voltage line L2 for supplying the first precharge voltage VBL0 is arranged in the region marked 'S10', and the row precharge voltage line L2 for supplying the second precharge voltage VBL1 is arranged in the region marked 'S11'. The regions 'S10' and 'S11' are alternately shown in FIG. 4, and thus the row precharge voltage line L2 for supplying the first precharge voltage VBL0 and the second precharge voltage line L2 for supplying the second precharge voltage VBL1 are alternately arranged.

The first precharge voltage VBL0 is supplied to the bit line precharge circuit units arranged in the region 'S10', and the second precharge voltage VBL1 is supplied to the bit line precharge circuit units arranged in the region 'S11'. Thus, precharge voltages having different levels can be applied to the bit line precharge circuit units, which are adjacent upwardly and downwardly to one another between which the memory cell arrays MA is interposed. Preferably, the row precharge voltage lines L2 are formed from metals or metallic materials.

Two column precharge voltage lines L3 are alternately arranged in a column direction, using in the regions S20 and S21 in which the sub word line drivers are arranged. As with the low precharge voltage lines L2, the two column precharge voltage lines L3 include the first precharge voltage lines VS0 and the second precharge voltage lines VS1.

In FIG. 4, the column precharge voltage line L3 for supplying the first precharge voltage VBL0 is arranged in the region marked 'S20', and the column precharge voltage line L3 for supplying the second precharge voltage VBL1 is arranged in the region marked 'S21'. According to an embodiment of the present invention, the column precharge voltage lines L3 are formed of the same interconnection material as that used in interconnection of bit lines. Preferably, the column precharge voltage lines L3 are formed of polysilicon or polysilicide. That is, the first and second main precharge voltage lines are formed of metals in a first layer, and the first and second row precharge voltage lines are formed of metals in a second layer, and the first and second column precharge voltage lines are formed of polysilicon or polysilicide in a third layer.

According to an embodiment of the present invention, the main precharge voltage lines L1, the row precharge voltage lines L2, and the column precharge voltage lines L3 are formed in three layers.

As described above, in the semiconductor memory device according to an embodiment of the present invention, the first and second precharge voltage lines VS0 and VS1 supply the same precharge voltages in a normal operation mode. Thus, potentials of the two voltage lines VS0 and VS1 must be the same. For this purpose, preferably, the semiconductor memory device according to an embodiment of the present invention can further include a precharge voltage equalizer.

Figure 5:
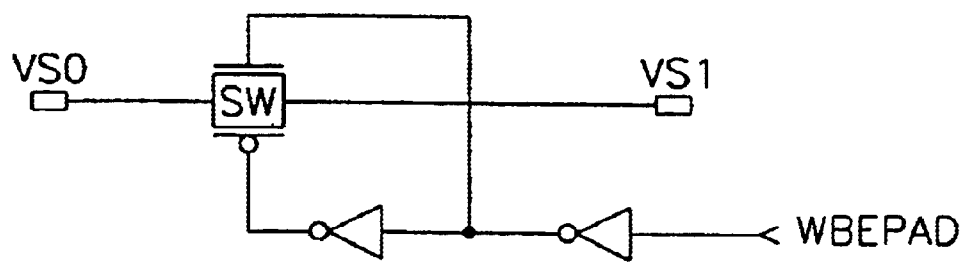
FIG. 5 is a circuit diagram of a precharge voltage equalizer of the semiconductor memory device according to an embodiment of the present invention.

FIG. 5 is a circuit diagram of a precharge voltage equalizer of the semiconductor memory device. Referring to FIG. 5, the precharge voltage equalizer includes a switch SW between the first and second precharge voltage lines VS0 and VS1.

The switch SW is turned on/off in response to a test mode signal WBEPAD. The test mode signal WBEPAD is a signal indicating that the semiconductor memory device enters into a specific test mode such as a wafer burn-in test mode.

If the test mode signal WBEPAD is enabled at a high level, the switch SW is turned off, thereby the first and second precharge voltage lines VS0 and VS1 are separated from each other. Thus, the first and second precharge voltage lines VS0 and VS1 independently operate, thereby supplying precharge voltages having different levels. In such a case, preferably, the precharge voltages having different levels are applied to the bit line pairs from the outside through pads of the semiconductor memory device.

If the test mode signal WBEPAD is disabled at a low level, the switch SW is turned on, thereby the first and second precharge voltage lines VS0 and VS1 are connected to each other. Thus, the first and second precharge voltage lines VS0 and VS1 have the same potentials, thereby supplying a precharge voltage having a single level. Thus, a difference in potentials between the two precharge voltage lines VS0 and VS1 caused by use of the two precharge voltage lines VS0 and VS1 can be eliminated. As a result, malfunction caused by errors of a data discriminating reference voltage can be prevented.

Figure 6:
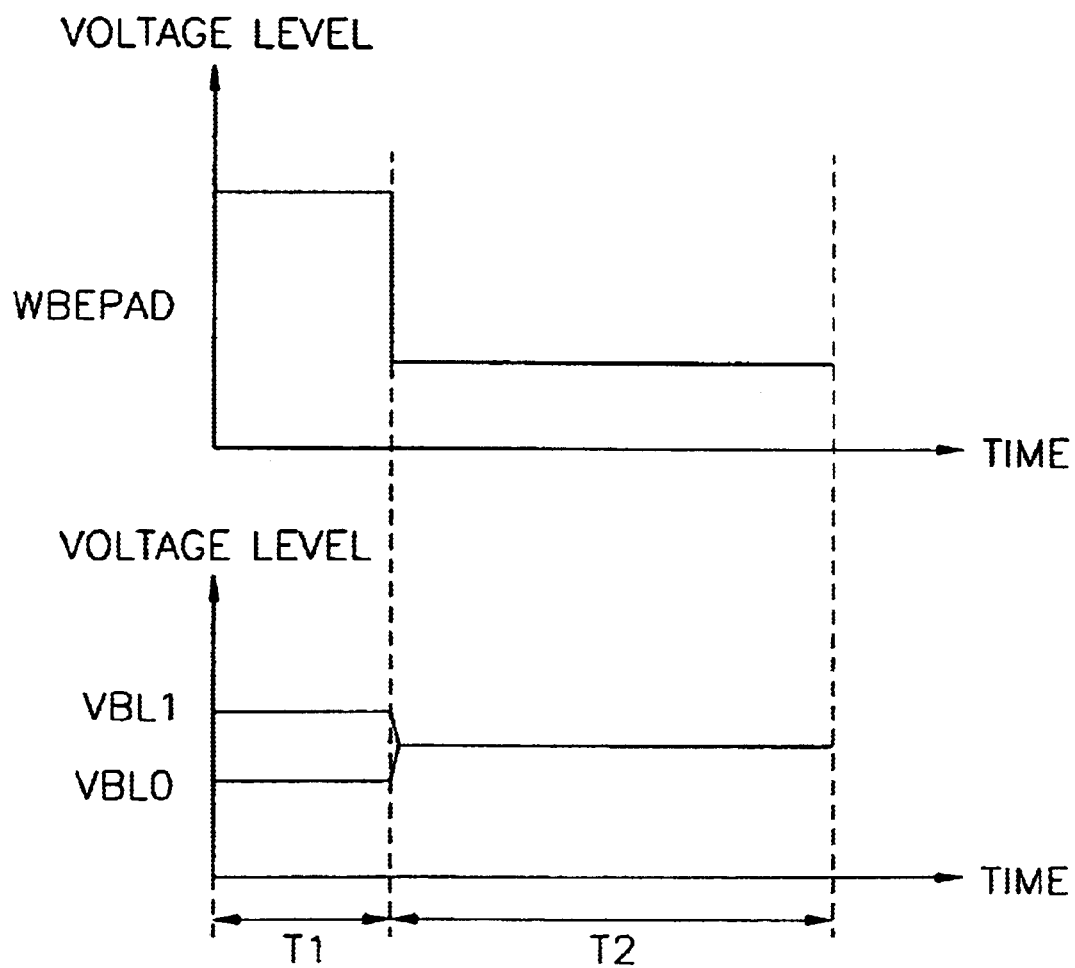
FIG. 6 is a waveform diagram illustrating voltage levels of a precharge power line of the semiconductor memory device according to an embodiment of the present invention.

FIG. 6 is a waveform diagram illustrating voltage levels of the precharge voltage lines VS0 and VS1 of the semiconductor memory device according to an embodiment of the present invention. Referring to FIG. 6, while the test mode signal WBEPAD is enabled at a high level (T1 period), the first and second precharge voltages VBL0 and VBL1 have different voltage levels. On the other hand, while the test mode signal WBEPAD is disabled at a low level (T2 period), the first and second precharge voltages VBL0 and VBL1 have the same voltage levels.

According to an embodiment of the present invention, the semiconductor memory device is capable of suppling two or more precharge voltages in the test mode, thereby increasing testing efficiency. In addition, the semiconductor memory device provides a stable reference voltage to all memory cells by supplying a precharge voltage having a single level in the normal operation mode for reading and writing data from and to memory cells.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:
   a plurality of memory cell arrays arranged in a matrix, each of the plurality of memory cell arrays having a plurality of memory cells and a plurality of bit line pairs for outputting and receiving data to and from each of the memory cells;
   a plurality of bit line precharge circuit units for precharging and equalizing corresponding bit line pairs of the memory cell arrays into predetermined precharge voltages; and
   a first precharge voltage line and a second precharge voltage line arranged in each region between the plurality of memory cell arrays,
   wherein during a first mode of operation, the first precharge voltage line and the second precharge voltage line supply a common precharge voltage and during a second mode of operation, precharge voltages having different levels are supplied at the first and the second precharge voltage lines to precharge memory cells adjacent to one another with different precharge voltages.

2. The device of claim 1, wherein the plurality of bit line precharge circuit units include a plurality of upper bit line precharge circuit units positioned at an upper part the plurality of memory cell arrays and a plurality of lower bit line precharge circuit units positioned at a lower part of the plurality of memory cell arrays, the plurality of upper bit line precharge circuit units alternately precharge bit line pairs of a corresponding memory cell array and the plurality of lower bit line precharge circuit units alternately precharge the remaining bit line pairs of the corresponding memory cell array.

3. The device of claim 1, wherein the first mode is normal operation mode and the second mode is test mode.

4. The device of claim 3, wherein the precharge voltages having different levels are applied to the bit line pairs from the outside through pads of the semiconductor memory device, and the precharge voltages having the same level are generated in a precharge voltage generator of the semiconductor memory device.

5. The device of claim 1 wherein during the second mode of operation, the precharge voltages having different levels are supplied simultaneously at the first and the second precharge voltage lines to precharge memory cells adjacent to one another with different precharge voltages.

6. A semiconductor memory device comprising:
a plurality of memory cell arrays arranged in a matrix, each of the plurality of memory cell arrays having a plurality of memory cells and a plurality of bit line pairs for outputting and receiving data to and from each of the memory cells;
a plurality of bit line precharge circuit units for precharging and equalizing corresponding bit line pairs of the memory cell arrays into predetermined precharge voltages;
first and second row precharge voltage lines arranged alternately in a first predetermined direction, the first row precharge voltage line for supplying a first precharge voltage to first bit line precharge circuit units and the second row precharge voltage line for supplying a second precharge voltage to second bit line precharge circuit units; and
first and second column precharge voltage lines arranged alternately in a second predetermined direction, the first column precharge voltage line for supplying the first precharge voltage to the first bit line precharge circuit units and the second column precharge voltage line for supplying the second precharge voltage to the second bit line precharge circuit units,
wherein the first and second precharge voltages are different voltage levels in a predetermined test mode and are the same voltage level in a normal operation mode.

7. The device of claim 6, further comprising a precharge voltage equalizer for connecting the first row precharge voltage line to the first column precharge voltage line connecting the second row precharge voltage line to the second column precharge voltage line in a test mode, and for separating first row precharge voltage line from the first column precharge voltage line and separating the second row precharge voltage line to the second column precharge voltage line in a normal operation mode.

8. The device of claim 6, further comprising:
a first main precharge voltage line for supplying the first precharge voltage to the first row precharge voltage lines and the first column precharge lines; and
a second main precharge voltage line for supplying the second precharge voltage to the second row precharge voltage lines and the second column precharge lines.

9. The device of claim 8, wherein the first and second main precharge voltage lines are formed of metals in a first layer, and the first and second row precharge voltage lines are formed of metals in a second layer, and the first and second column precharge voltage lines are formed of polysilicon in a third layer.

10. The device of claim 6, wherein the first predetermined direction is a row direction of the semiconductor memory device, and the second predetermined direction is a column direction of the semiconductor memory device.

11. The device of claim 10, wherein the first and second row precharge voltage lines are arranged in the row direction in a region between the memory cell arrays, and the first and second column precharge voltage lines are arranged in the column direction in a region between the memory cell arrays.

12. The device of claim 6, wherein the first precharge voltage and the second precharge voltage having different levels are applied to the bit line pairs from the outside through pads of the semiconductor memory device, and the first precharge voltages and the second precharge voltage having the same level are generated in a precharge voltage generator of the semiconductor memory device.

13. The device of claim 6, wherein the test mode is a wafer burn-in test mode.

14. The device of claim 6, wherein the plurality of bit line precharge circuit units include a plurality of upper bit line precharge circuit units positioned at an upper part of the memory cell arrays and a plurality of lower bit line precharge circuit units positioned at a lower part the memory cell arrays, the plurality of upper bit line precharge circuit units alternately precharge bit line pairs of the corresponding memory cell array, and the plurality of lower bit line precharge circuit units alternately precharge the remaining bit line pairs of the corresponding memory cell array.

15. The device of claim 6 wherein the first and second precharge voltages having different levels are supplied simultaneously to the first and second bit line pairs, respectively, in the predetermined test mode.

16. A method of operating and testing a semiconductor memory device having a plurality of memory cell arrays arranged in a matrix, each of the plurality of memory cell arrays having a plurality of memory cells and a plurality of bit line pairs for outputting and receiving data to and from each of the memory cells, the method comprising the steps of;
supplying a first precharge voltage to the first bit line pairs connected to a first plurality of voltage lines arranged alternately with a second plurality of voltage lines; and
supplying a second precharge voltage to second bit line pairs connected to the second plurality of voltage lines,
wherein the first and second precharge voltages are different voltage levels in a predetermined test mode and are at the same voltage level in a normal operation mode.

17. The method of claim 16, further comprising the step of precharging and equalizing corresponding the first bit line pairs and the second bit line pairs into predetermined precharge voltages.

18. The method of claim 17, wherein the step of precharging and equalizing is performed in a plurality of first bit line precharge circuit units having the first bit line pairs and in a plurality of second bit line precharge circuit units having the second bit line pairs.

19. The method of claim 18, wherein the plurality of first bit line precharge circuit units are positioned at a first part of the memory cell arrays and the plurality of second bit line precharge circuit units are positioned at a second part of the memory cell arrays, the first part and the second part are disposed opposite sides of the memory cell arrays.

20. The method of claim 19, wherein the plurality of first bit line precharge circuit units alternately precharges bit line pairs of the corresponding memory cell array, and the plurality of second bit line precharge circuit units alternately precharge the remaining bit line pairs of the corresponding memory cell array.

21. The method of claim 16, further comprising the steps of:

connecting the first precharge voltage line to the second precharge voltage line in the test mode; and separating the first precharge voltage line from the second precharge voltage line in the normal operation mode.

22. The method of claim 21, wherein the steps of connecting the first precharge voltage line to the second precharge voltage line in the test mode and separating the first precharge voltage line from the second precharge voltage line in the normal operation mode are performed in a precharge voltage equalizer.

23. The method of claim 22, wherein the precharge voltage equalizer comprises a switch between the first precharge voltage line and the second precharge voltage line.

24. The method of claim 23, wherein the switch is turned on or off in response to a test mode signal.

25. The method of claim 16 wherein the first and second precharge voltages having different levels are supplied simultaneously to the first and second bit line pairs, respectively, in the predetermined test mode.

* * * * *